United States Patent [19]

Tsumura

[11] Patent Number: 5,116,783
[45] Date of Patent: May 26, 1992

[54] METHOD OF PRODUCING SEMICONDUCTOR DEVICE

[75] Inventor: Kiyoaki Tsumura, Itami, Japan

[73] Assignee: Mitsubishi Denki Kabushiki Kaisha, Tokyo, Japan

[21] Appl. No.: 392,553

[22] Filed: Aug. 11, 1989

[30] Foreign Application Priority Data

Jan. 13, 1989 [JP] Japan ................. 1-6827

[51] Int. Cl.$^5$ .............................. H01L 23/30
[52] U.S. Cl. .................... 437/211; 437/183; 437/198; 437/220
[58] Field of Search .......... 437/211, 188, 182-183, 437/196, 198, 209, 220

[56] References Cited

U.S. PATENT DOCUMENTS

| | | | |
|---|---|---|---|
| 3,125,803 | 3/1964 | Rich | 437/209 |
| 3,790,866 | 2/1974 | Meyer et al. | 357/81 |
| 4,139,726 | 2/1979 | Penrod et al. | 357/74 |
| 4,821,148 | 4/1989 | Kobayashi et al. | 437/211 |
| 4,821,944 | 4/1989 | Tsumura | 228/10 |
| 4,842,662 | 6/1989 | Jacobi | 437/209 |
| 4,891,333 | 1/1990 | Baba et al. | 437/219 |

FOREIGN PATENT DOCUMENTS

| | | | |
|---|---|---|---|
| 55-105339 | 8/1980 | Japan | 437/209 |
| 60-194534 | 10/1985 | Japan | 437/209 |
| 62-265729 | 11/1987 | Japan . | |
| 63-164329 | 7/1988 | Japan . | |
| 63-250828 | 10/1988 | Japan . | |
| 1-047039 | 2/1989 | Japan . | |
| 1-143332 | 6/1989 | Japan . | |
| 1-201934 | 8/1989 | Japan . | |

OTHER PUBLICATIONS

Chemical Abstract 108(16):141335y.
Chemical Abstract 108(10):85976u.
Tsumura, "Fundamental Study of the Copper Wire Ball Bonding Technology", May 25-27, 1988.

Primary Examiner—Robert Kunemund
Assistant Examiner—Andrew Griffis
Attorney, Agent, or Firm—Leydig, Voit & Mayer

[57] ABSTRACT

A method of producing a semiconductor device includes bonding a semiconductor chip to a die pad of a lead frame by means of a silicone resin, to bonding a copper wire and an aluminum electrode of the semiconductor chip in such a manner that intermetallic compound mainly consisting of $CuAl_2$ is formed in the bonding region. This method suppresses the deterioration of the copper-aluminum alloy layer and these semiconductor devices have a high reliability at a high temperature, as well as uniform quality in the production.

2 Claims, 6 Drawing Sheets

METHOD OF PRODUCING SEMICONDUCTOR DEVICE

BACKGROUND OF THE INVENTION

1. Field of the Invention

The present invention relates to a method of producing a semiconductor device and, more particularly, to a method of producing a semiconductor device in which fine metallic wires, except for gold wire, are used for the purpose of wiring between electrodes of a semiconductor chip and external leads, with a higher reliability than that of semiconductor devices using gold wire bonding.

2. Description of the related Art

FIGS. 1 and 2 are sectional views of semiconductor devices produced through known processes, particularly electrode structures of the device. Each semiconductor device 1, 1a has an Si substrate 11 on which is formed an $SiO_2$ film 12 which in turn is overlaid by an Al film 13.

The Si substrate 11 is bonded to a die pad 14 of a lead frame by a bonding material such as an epoxy resin 16 or an Au-Si solder 17. A fine metallic wire 21, which is in this case a copper wire, was melted at its end in order to form a copper ball 22. The copper ball 22 is pressed against the AL film 13 by means of a capillary Tip (not shown) in order to deform the ball plastically. Meanwhile, ultrasonic energy is applied together with heat energy, to a temperature of 250° to 400° C., from the Si substrate 11, so that an intermetallic compound is formed between the Al film 13 and the copper ball 22. More specifically, the intermetallic compound phases 31, 32 and 33 are, respectively, the $\theta$ phase ($CuAl_2$), $\eta_2$ phase ($CuAl_2$) and $\gamma_2$ phase ($Cu_9Al_4$) of the copper and aluminum. This semiconductor device is then sealed with ceramic having an empty room for the chip or molded with resin. It seems that the $\theta$ phase, layer 31 shown in FIG. 1 is a non-uniform alloy layer the thickness of which fluctuates largely, whereas the $\theta$ phase 31, $\eta_2$ phase 32 and $\gamma_2$ phase 33 shown in FIG. 2 are uniform alloy layers with little fluctuation in thickness.

The intermetallic compound of the alloy layer can be identified by the alloy layer phase color: namely, by etching the Al layer 13 with phosphoric acid ($H_3PO_4$), causing the copper ball 22 to color by treating the same with an aqueous solution of sodium hydroxide (NaOH), and identifying the $\theta$ phase layer 31 by a brown color at the bonding face.

FIG. 3 is a schematic illustration of bonding face of the copper ball 22 shown in FIG. 1. In this case, the brown color ($\theta$ phase) 31 does not exist uniformly over the entire area and non brown colored portions where the $\theta$ phase is not formed are observed here and there.

FIG. 4 is a schematic illustration of bonding face of the copper ball 22 shown in FIG. 2. The brown color ($\theta$ phase) is spread over the entire area, and the white and blue color $\eta_2$ phase 32 or $\gamma_2$ phase 33 exist in local areas.

Japanese Published Patent Application 62-265729 discloses a semiconductor device. Judging from the description in the specification, it is understood that the structure of this device is similar to those shown in FIGS. 2 and 4, i.e., the $\theta$ phase ($CuAl_2$), $\eta_2$ phase (CuAl) and $\gamma_2$ phase ($Cu_9Al_4$) exist in the alloy layer.

The known semiconductor device has an above bonding structure. Then it is sealed with ceramic having an empty room for the chip or molded with resin.

The reliability of the semiconductor device is evaluated by an accelerated reliability test. The empty ceramic seal package device has little problems. However, when the device is molded in epoxy resin and especially during the high temperature (250° C.) storage test, the reliability of this device is subject to larger fluctuations than that of the device in which gold wire is used. In addition, the device life during high temperature storage test is substantially equivalent to the device using gold wire used device, thus the expectation that the copper wire can expand the operational margin in higher temperature region over the gold wire.

SUMMARY OF THE INVENTION

Accordingly, an object of the present invention is to solve the above problem, preventing the copper-aluminum alloy layer from degrading in epoxy resin molded at a high temperature, and providing a method for producing stable semiconductor devices.

To this end, according to one aspect of the present invention, there is provided a method of producing a semiconductor device comprising the steps of: bonding a semiconductor chip to a die pad, of a lead frame by means of a bonding material; connecting an aluminum electrode on the chip to an external lead by means of a copper wire; and molding entirely by resin. In detail, the copper ball formed at an end of, the copper wire is pressed onto the electrode of the the semiconductor chip which is heated, the copper ball is plastically deformed the chip so that a phase intermetallic compound ($CuAl_2$) is produced.

The above and other objects, features and advantages of the present invention will become clear from the following description of the preferred embodiments.

DESCRIPTION OF THE PREFERRED EMBODIMENT

A preferred embodiment of the present invention will be described with reference to the accompanying drawings.

The following test was conducted in order to examine the behavior of a copper-aluminum alloy in molding an epoxy resin. Pieces of a single phase-bulk, namely, the $\theta$ phase (CuAl$_2$), $\eta_2$ phase (CuAl) and $\gamma_2$ phase (Cu$_9$Al$_4$), as well as a multi-phase bulk were made the by cleaning the surface of Al and Cu bulk, rolling together the Al an Cu and storing the product at a high temperature to diffuse the Al and Cu each other. These bulks were molded in epoxy resin and stored at a high temperature. Cross sections of these samples were then observed.

Figure 5A:
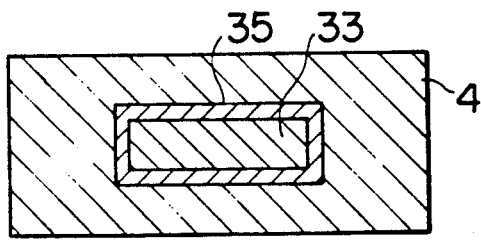
FIGS. 5(a) to 5(c) are sectional views of an samples of epoxy-resin-molded single-phase bulk copper-aluminum alloy after being stored at a high temperature.
Figure 5B:
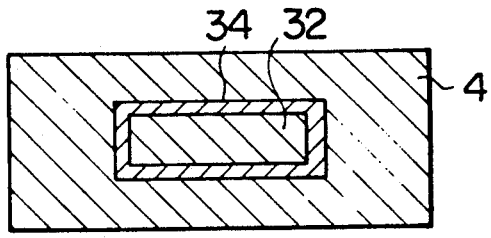
Figure 5C:
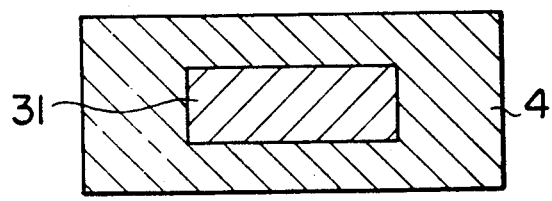
Figure 6:
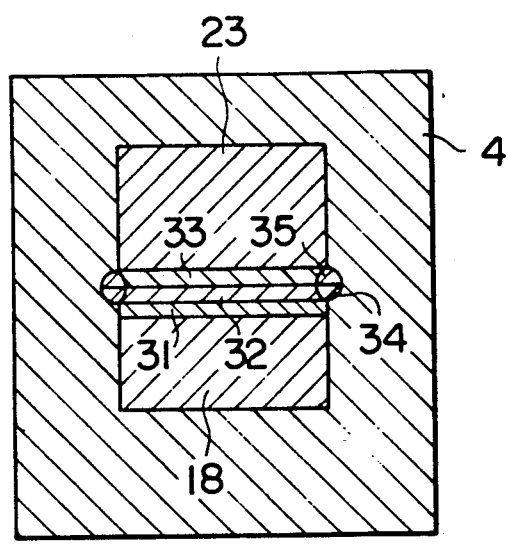
FIG. 6 is a sectional view of a sample of a multi-phase bulk copper-aluminum alloy after a series of steps including rolling heat-treating, epoxy-resin-molding, and storage at a high temperature.

FIGS. 5(a) to 5(c) schematically show sections of the single-phase bulk, while FIG. 6 illustrates the section of a multi-phase bulk.

Referring to FIG. 5(b), a deteriorated $\eta_2$ phase 34 was observed around the $\eta_2$ phase 32, whereas, in FIG. 5(a), a deteriorated $\gamma_2$ phase 35 was observed around the $\gamma_2$ phase 33. However, no deterioration was observed with the $\theta$ phase 31, as shown in FIG. 5(c). Referring now to the multi-phase bulk, no deterioration was observed with the bulk Al 18, bulk Cu 23 and the $\theta$ phase 31, but the $\eta_2$ phase and the $\gamma_2$ phase showed deterioration as denoted by 34 and 35.

From the result of this analysis, it is understood that in the copper-aluminum alloy there is an alloy phase which is deteriorated selectively when the alloy is stored at a high temperature molded in an epoxy resin.

Figure 1:
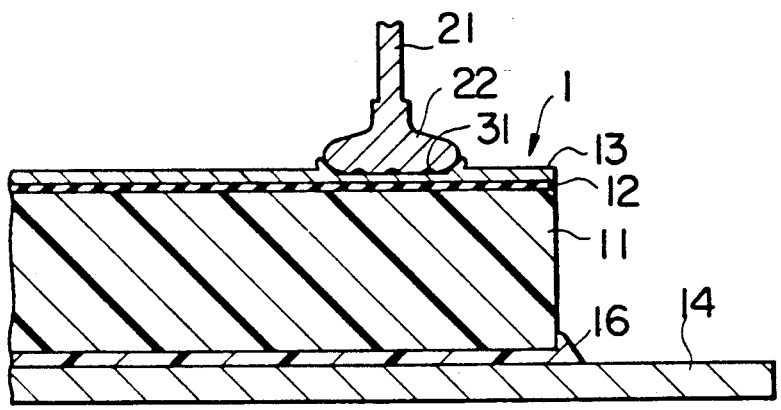
FIGS. 1 and 2 are sectional views of semiconductor devices produced by conventional methods.
Figure 2:
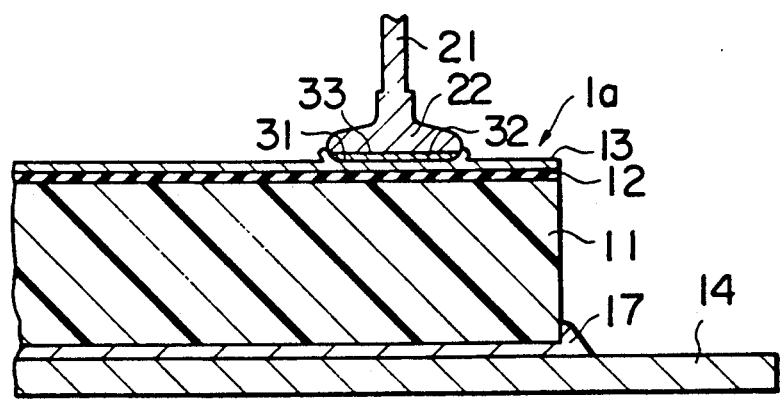
Figure 3:
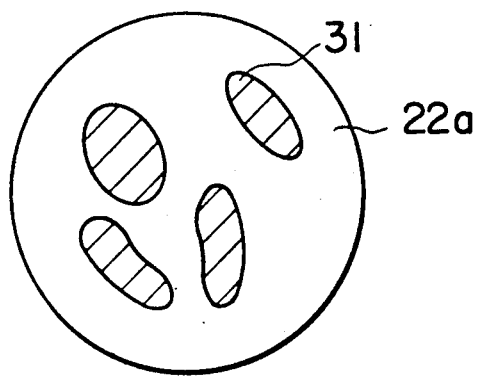
FIG. 3 is the schematic view showing bonding face of a copper ball of FIG. 1.
Figure 4:
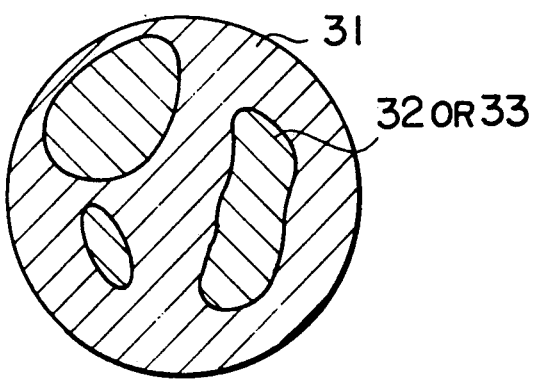
FIG. 4 is a schematic view showing the bonding face of the copper ball of FIG. 2.
Figure 7:
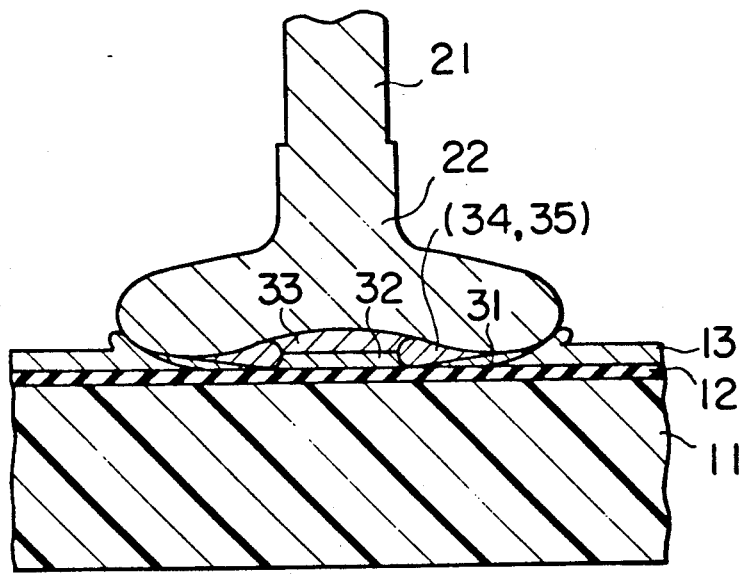
FIGS. 7 and 8 are sectional views of the copper-aluminum bonding portion of the semiconductor device of FIG. 2 after being stored at a high temperature.
Figure 8:
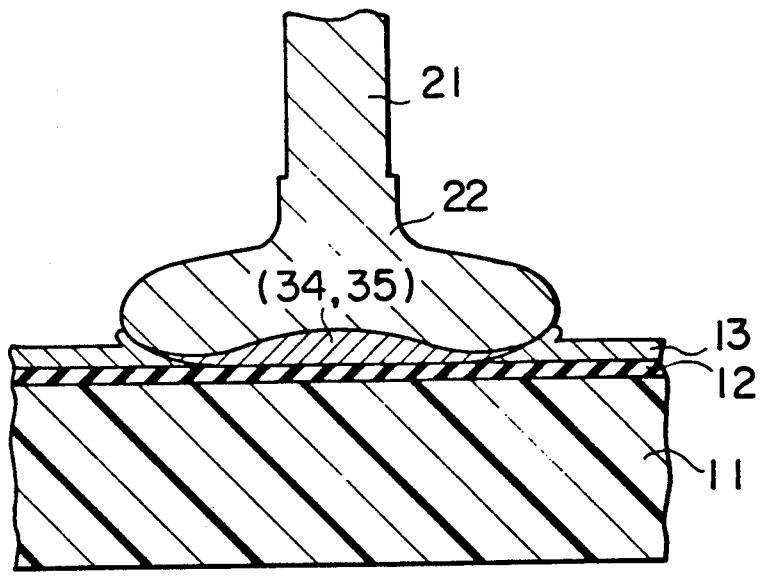

In order to confirm this fact on an actual bonding of an Al electrode and a copper wire, a test was carried out in accordance with the following procedure. Namely, a resin-molded semiconductor device as shown in FIG. 2 was stored in a thermostatic oven at a temperature of 250° C., and the electrical resistance of the bonding boundary of the electrode and the copper wire 21 was measured in order to examine the state of deterioration of the bonding area. FIGS. 7 and 8 show the cross sections of the bonding area stored for 20-hours and for 30-hours, respectively.

Referring first to FIG. 7, the region of deterioration goes through from the annular boundary of the copper ball 22 and the Al layer 13 area into the copper ball 22 center and spreads widely. It is observed that a $\theta$ phase 31 is formed on the Al layer 13. In addition, a $\eta_2$ phase 32 and a $\gamma_2$ phase 33 are formed in the core portion of the copper ball 22 into which the deterioration has not propagated yet. In addition, deteriorated $\eta_2$ phase and deteriorated $\gamma_2$ phase, 34 and 35, are observed in the annular boundary of the copper ball 22.

Referring now to FIG. 8 showing the state after storage for 30-hours at a high temperature, it is observed that the whole bonding area has been deteriorated completely. In these results, the following is concluded. Namely, during long storage at 250° C., the deterioration and the growth of the copper-aluminum layer proceed simultaneously; that is the deteriorated regions 34 and 35 of $\eta_2$ phase and $\gamma_2$ phase spread simultaneously with the growth of the $\eta_2$ phase 32 and $\gamma_2$ phase 33 as confirmed through the bulk test mentioned before. Actually, the life of the bonding area of a semiconductor device which means the a failure as an open circuit occurs in a state between FIG. 7 and FIG. 8.

Through a series of tests explained hereinabove, the inventors have found that the technology of making an uniform $\theta$ phase only in the bonding area produces the highest reliability for semiconductor devices using copper wire 21.

The invention will be more fully understood from the following description for producing a semiconductor device.

Figure 9:
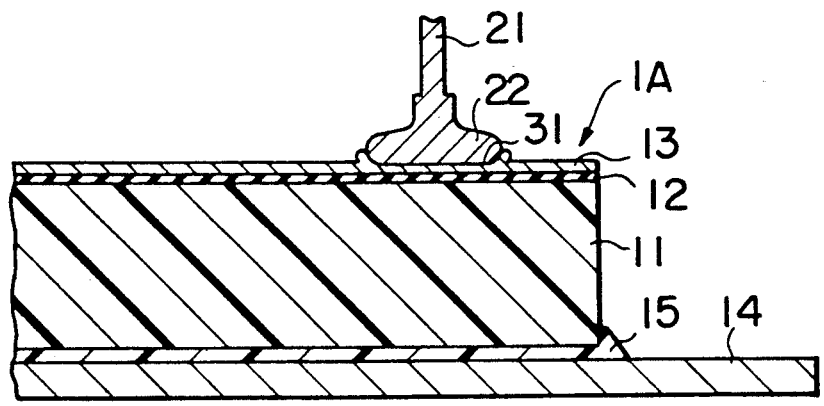
FIG. 9 is a sectional view of a semiconductor device produced in accordance with the method of the present invention.

Referring to FIG. 9, an Si substrate 11 of a semiconductor device 1A is bonded to a die pad 14 of a lead frame, by means of a silicone resin 15 used as the bonding material. A fine metal wire which is, in this case, a copper wire 21 is melted at its end to form a copper ball 22. The copper ball 22 is pressed with a force of 130g to 180g by a capillary chip (not shown) onto an A layer 13 on an SiO$_2$ layer 12 formed on the Si substrate 11, to be deformed the ball plastically. At the same time, ultrasonic wave energy at a 60 KHz frequency is applied to the bonding region of the copper ball 22 and the Al layer 13 with the capillary tip for 30 msec, to remove oxide films on the surfaces of the copper ball 22 and the Al layer 13, thereby the slip lines, with non-oxidized faces of Cu and Al atoms, are exposed. In consequence, the atoms of Cu and Al are diffused into each other by the heat energy applied to the bonding region, the heat energy being generally large enough to maintain the bonding region at 250° to 400° C. The $\theta$ phase intermetallic compound CuAl$_2$ is formed as a result of the mutual diffusion of Cu and Al. The $\theta$-phase intermetallic compound CuAl$_2$ is formed when the copper atoms are diffused in Al atoms at a ratio of Al : Cu=2:1. In the method of this invention, the growth of the $\theta$-phase region 31 is promoted, when the bonding pressure and temperature are certain values the temperature of the Cu atoms is higher than that of the Al atoms or the vibration of the Al atoms is more vigorous than that of the Cu atoms. After the bonding, the copper ball 22 and the Al layer are sealed with ceramics or molded with an epoxy resin.

Thus, in the semiconductor device of the present invention, the bonding region is substantially occupied by $\theta$-phase intermetallic compound region 31. When this semiconductor device is stored at 250° C., $\eta_2$ phase 32 and the $\gamma_2$ phase 33 which do not exist initially start to appear and, at the same time, deterioration starts due to the influence of an epoxy resin. Thus, the deterioration and growth of the alloy layer proceed simultaneously and the device life is reduced when the state shown in FIG. 7 is reached.

Figure 10:
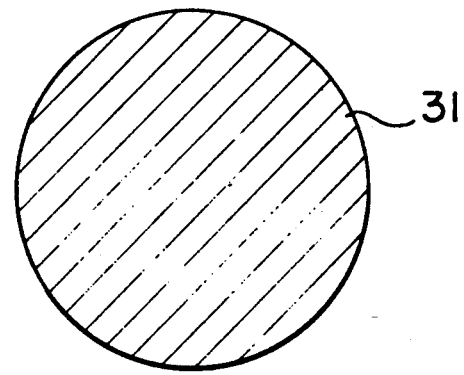
FIG. 10 is a schematic view showing the bonding face of the copper ball of the structure shown in FIG. 9.

The production of the semiconductor device can be carried out while evaluating of the state of the $\theta$ phase 31. More specifically, the production may be done by selecting some samples of the semiconductor devices and carrying out the color testing employing, as explained in connection with the prior art, etching of the bonding area with a phosphoric acid and then coloring with an aqueous solution of sodium hydroxide. The production may be continued when at least 80%, for example, of the whole bonding area exhibits a brown color indicating of the presence of the $\theta$ phase face. Such a process ensures the continuous production of semiconductor devices while ensuring high quality of the products. FIG. 10 schematically shows the state in which $\theta$ phase 31 is formed uniformly all over the bonding face.

As will be seen from the foregoing description, the characteristic feature of this invention resides in an optimization of the die bonding material which bonds a semiconductor chip and a die pad. Properties of the silicone resin used as the bonding material in this embodiment are shown in the following table together with those of an epoxy resin and an Au-Si solder which are used conventionally.

Properties of Die Bond Materials

| Bonding material | Elasticity Modulus (Kg/cm$_2$) | Melting point or Glass Transition Point |
| --- | --- | --- |
| Silicone resin | $1.0 \times 10^2$ | $-120°$ C. |
| Epoxy resin | $2.86 \times 10^4$ | $180°$ C. |
| Au—Si | $7.1 \times 10^5$ | $450°$ C. |

The Au-Si solder does not melt at the wire bonding temperature, and exhibits a high elasticity modulus. In addition, this bonding material tends to allow the generation of all phase intermetallic compound, i.e., $\eta_2$, $\gamma_2$, and the $\theta$ phases of the. On the other hand, the epoxy resin has a glass transition point (Tg) below the wire bonding temperature, so that it is thermally decomposed as the elasticity modulus is impaired and the $\theta$ phase region is formed non-uniformly. More specifically, the elasticity modulus decreases non-linearly, so that the Si substrate 11 may come off the die pad 14. In addition, the ultrasonic vibration behaves in an irregular manner. In contrast, the silicone resin has a glass transition point (Tg) which is much lower than the wire bonding temperature so that there is no break-down in this resin in the course of bonding. In consequence, the elasticity modulus does not change non-linearly and does not exceed $1.0 \times 10^2$ kg/cm$^2$, so that the $\theta$ phase region can be formed uniformly.

Although a silicone resin is used in the described embodiment, this is only illustrative and other suitable materials which have an elasticity modulus below $1.0 \times 10^2$ kg/cm$^2$ from the room temperature to about 400° C. can produce an equivalent effect. The elasticity modulus of such materials preferably range between 1 kg/cm$^2$ and $1.0 \times 10^2$ kg/cm$^2$.

Figure 11:
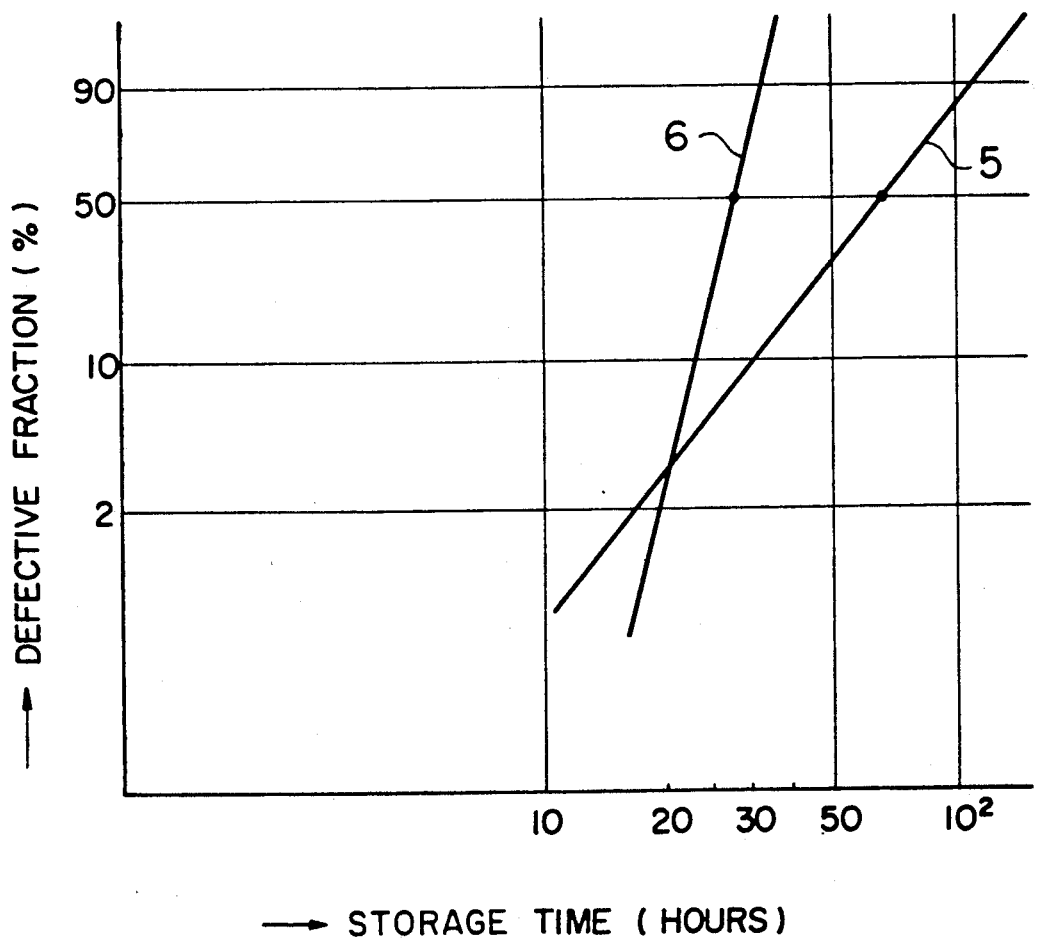
FIG. 11 is a graph showing the defective fraction in relation to storage time observed in a high-temperature reliability test for of a conventional semiconductor device and one according to the present invention.

FIG. 11 is the, Weibull plot showing the defective fraction of devices vs. semiconductor device storage time at 250° C. Characteristics of a semiconductor device produced by the method of the invention and a conventional semiconductor device are denoted by 5 and 6, respectively. It is observed that the semiconductor device produced by the method of the invention exhibits high reliability even after being stored for 100 to 130 hours, whereas the conventional semiconductor device exhibits comparatively short reliability, it is about 20 to 30 hours.

What is claimed is:

1. A method of producing a semiconductor device comprising:

bonding a semiconductor chip having an aluminum electrode to a die pad of a lead frame with a bonding material disposed between the lead frame and die pad and having an elasticity modulus ranging between 1 kg/cm$^2$ and 100 kg/cm$^2$ from room temperature to about 400° C.;

melting an end of a copper wire to form a copper ball;

heating the aluminum electrode and pressing the copper ball on the heated aluminum electrode while applying ultrasonic energy to the heated aluminum electrode to deform the copper ball plastically and to form a $\theta$ phase intermetallic compound (CuAl$_2$) of copper and aluminum in the region where the deformed copper ball contacts the electrode; and encapsulating the bond between the aluminum electrode and the copper wire with an epoxy resin.

2. A method according to claim 1 including bonding the chip with a silicone resin as the bonding material.

* * * * *